(12) United States Patent
Helm et al.

(10) Patent No.: US 7,202,129 B2
(45) Date of Patent: Apr. 10, 2007

(54) SOURCE LINES FOR NAND MEMORY DEVICES

(75) Inventors: Mark A. Helm, Boise, ID (US); Roger W. Lindsay, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/247,043

(22) Filed: Oct. 11, 2005

(65) Prior Publication Data

US 2006/0030146 A1 Feb. 9, 2006

Related U.S. Application Data

(62) Division of application No. 10/855,844, filed on May 27, 2004, now Pat. No. 7,112,488.

(51) Int. Cl.
*H01L 21/336* (2006.01)

(52) U.S. Cl. .................................. 438/257; 257/E21.69

(58) Field of Classification Search ........ 438/257–267, 438/FOR. 203; 257/314–320, E21.68, E21.681, 257/E21.69

See application file for complete search history.

(56) References Cited

U.S. PATENT DOCUMENTS

| 6,515,329 B2 | 2/2003 | Lee | |
|---|---|---|---|
| 6,762,093 B2 * | 7/2004 | Rudeck | ....................... 438/257 |
| 7,115,509 B2 * | 10/2006 | Chen et al. | .................. 438/684 |
| 2003/0080374 A1 * | 5/2003 | Arai | ........................... 257/321 |

* cited by examiner

*Primary Examiner*—Brook Kebede
(74) *Attorney, Agent, or Firm*—Leffert, Jay & Polglaze P.A.

(57) ABSTRACT

A source line is formed by forming a source slot in a bulk insulation layer overlying a substrate to expose a portion of a substrate within the source slot, where the exposed portion of the substrate includes source regions of select gates associated with two or more columns of serially-connected floating-gate transistors formed on the substrate. A layer of epitaxial silicon is grown on the exposed portion so as to partially fill the source slot. A conductive layer is formed on the bulk insulation layer and on the layer of epitaxial silicon so as to substantially fill an unfilled portion of the source slot. The conductive layer is removed from a surface of the bulk insulation layer.

20 Claims, 7 Drawing Sheets

Fig. 6C

SOURCE LINES FOR NAND MEMORY DEVICES

CROSS-REFERENCE TO RELATED APPLICATION

This is a divisional application of application Ser. No. 10/855,844, titled "SOURCE LINES FOR NAND MEMORY DEVICES," filed May 27, 2004 now U.S. Pat. No. 7,112,488, which application is assigned to the assignee of the present invention and the entire contents of which are incorporated herein by reference.

TECHNICAL FIELD OF THE INVENTION

The present invention relates generally to memory devices and in particular the present invention relates to source lines for NAND memory devices.

BACKGROUND OF THE INVENTION

Memory devices are typically provided as internal storage areas in computers. The term memory identifies data storage that comes in the form of integrated circuit chips. In general, memory devices contain an array of memory cells for storing data, and row and column decoder circuits coupled to the array of memory cells for accessing the array of memory cells in response to an external address.

One type of memory is a non-volatile memory known as flash memory. A flash memory is a type of EEPROM (electrically-erasable programmable read-only memory) that can be erased and reprogrammed in blocks. Many modern personal computers (PCs) have their BIOS stored on a flash memory chip so that it can easily be updated if necessary. Such a BIOS is sometimes called a flash BIOS. Flash memory is also popular in wireless electronic devices because it enables the manufacturer to support new communication protocols as they become standardized and to provide the ability to remotely upgrade the device for enhanced features.

A typical flash memory comprises a memory array that includes a large number of memory cells arranged in row and column fashion. Each of the memory cells includes a floating-gate field-effect transistor capable of holding a charge. The cells are usually grouped into blocks. Each of the cells within a block can be electrically programmed on an individual basis by charging the floating gate. The charge can be removed from the floating gate by a block erase operation. The data in a cell is determined by the presence or absence of the charge on the floating gate.

NOR and NAND flash memory devices are two common types of flash memory devices, so called for the logical form the basic memory cell configuration in which each is arranged. Typically, for NOR flash memory devices, the control gate of each memory cell of a row of the array is connected to a word-select line, and the drain region of each memory cell of a column of the array is connected to a bit line. The memory array for NOR flash memory devices is accessed by a row decoder activating a row of floating gate memory cells by selecting the word-select line coupled to their gates. The row of selected memory cells then place their data values on the column bit lines by flowing a differing current, depending upon their programmed states, from a coupled source line to the coupled column bit lines.

The array of memory cells for NAND flash memory devices is also arranged such that the control gate of each memory cell of a row of the array is connected to a word-select line. However, each memory cell is not directly coupled to a column bit line by its drain region. Instead, the memory cells of the array are arranged together in strings (often termed NAND strings), typically of 32 each, with the memory cells coupled together in series, source to drain, between a source line and a column bit line. The memory array for NAND flash memory devices is then accessed by a row decoder activating a row of memory cells by selecting the word-select line coupled to a control gate of a memory cell. In addition, the word-select lines coupled to the control gates of unselected memory cells of each string are driven to operate the unselected memory cells of each string as pass transistors, so that they pass current in a manner that is unrestricted by their stored data values. Current then flows from the source line to the column bit line through each series coupled string, restricted only by the selected memory cells of each string. This places the current-encoded data values of the row of selected memory cells on the column bit lines.

The source line should have a low resistance to keep the voltage drop along the source line low so as to avoid memory device failure. Moreover, the source line should have low current leakage when biasing the source line. Source lines are often made from polysilicon, which normally satisfies current-leakage requirements, but has a relatively high resistance that can cause excessive voltage drops that may lead to device failure. Connecting each NAND string to a metal line formed on a layer different from that containing the NAND strings using a polysilicon contact can reduce resistance. However, this method requires a patterned masking step for forming the metal line and another patterned masking step for forming the contacts. Forming a metal line on a different level than the polysilicon source line and periodically connecting the source line and metal line by forming contacts between the source and metal lines can reduce the resistance compared to an all polysilicon source line. However, each contact consumes silicon real estate.

For the reasons stated above, and for other reasons stated below which will become apparent to those skilled in the art upon reading and understanding the present specification, there is a need in the art for alternative source lines for NAND flash memory devices.

SUMMARY

The above-mentioned problems with source lines for NAND flash memory devices and other problems are addressed by the present invention and will be understood by reading and studying the following specification.

For one embodiment, the invention provides a method of forming a portion of a NAND memory including forming a source line. Forming the source line includes forming a source slot in a bulk insulation layer overlying a substrate to expose a portion of the substrate within the source slot, where the exposed portion of the substrate includes source regions of select gates associated with two or more columns of serially-connected floating-gate transistors formed on the substrate. A layer of epitaxial silicon is grown on the exposed portion so as to partially fill the source slot. A conductive layer is formed on the bulk insulation layer and on the layer of epitaxial silicon so as to substantially fill an unfilled portion of the source slot. The conductive layer is removed from a surface of the bulk insulation layer.

The invention further provides methods of varying scope.

DETAILED DESCRIPTION

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

Figure 1:
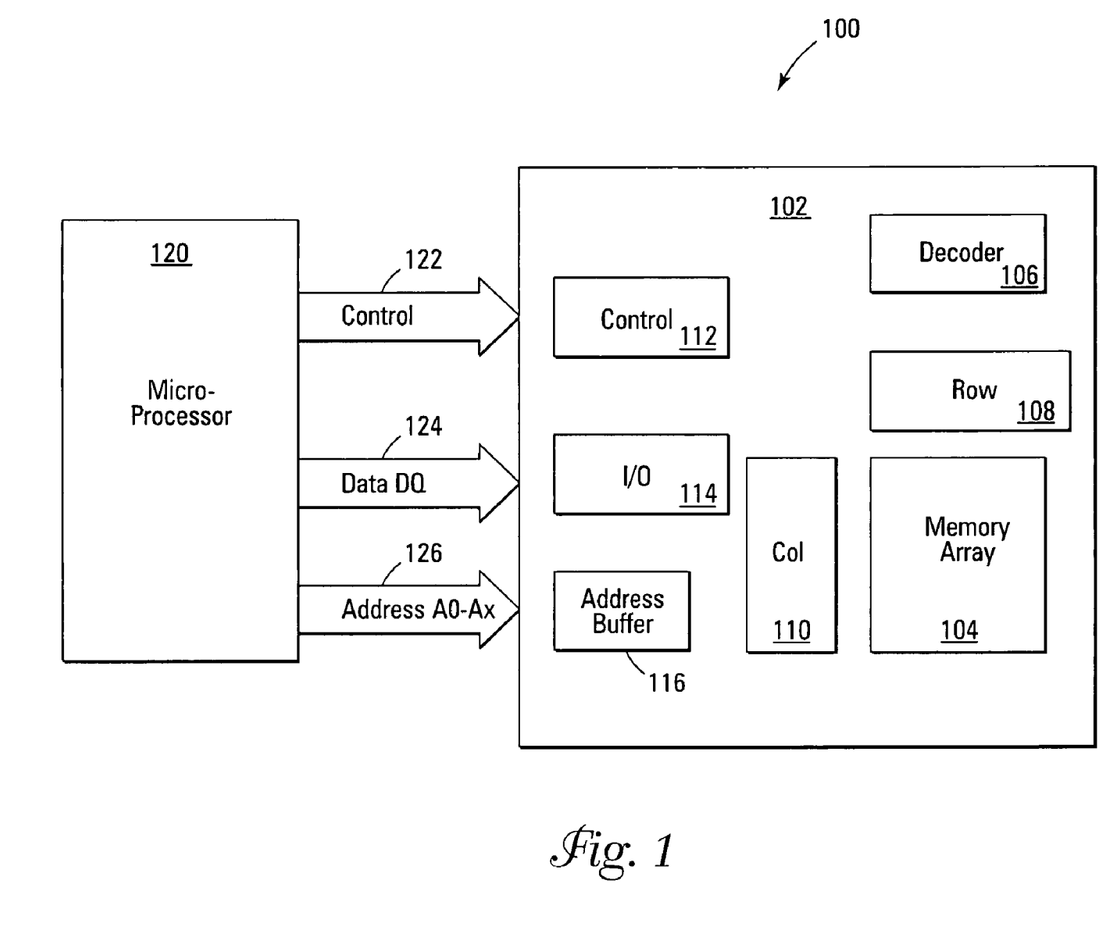
FIG. 1 is a simplified block diagram of a memory system according to an embodiment of the present invention.

FIG. 1 is a simplified block diagram of a memory system 100 according to an embodiment of the invention. Memory system 100 includes an integrated circuit NAND flash memory device 102 that includes an array of flash memory cells 104, an address decoder 106, row access circuitry 108, column access circuitry 110, control circuitry 112, Input/Output (I/O) circuitry 114, and an address buffer 116. Memory system 100 includes an external microprocessor 120, or memory controller, electrically connected to memory device 102 for memory accessing as part of an electronic system. The memory device 102 receives control signals from the processor 120 over a control link 122. The memory cells are used to store data that are accessed via a data (DQ) link 124. Address signals are received via an address link 126 that are decoded at address decoder 106 to access the memory array 104. Address buffer circuit 116 latches the address signals. The memory cells are accessed in response to the control signals and the address signals. It will be appreciated by those skilled in the art that additional circuitry and control signals can be provided, and that the memory device of FIG. 1 has been simplified to help focus on the invention.

Figure 2:
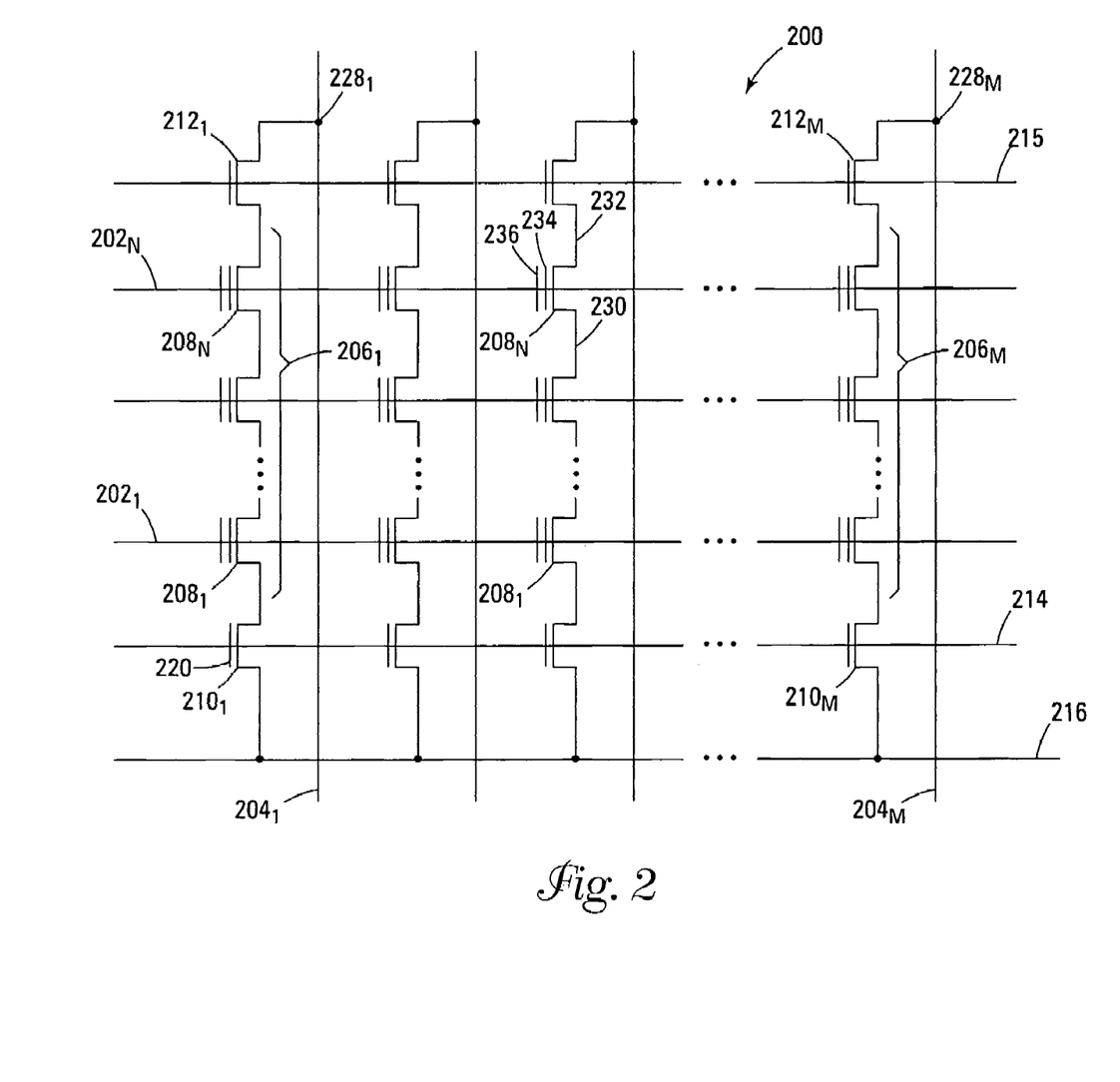
FIG. 2 is a schematic of a NAND memory array according to another embodiment of the present invention.

FIG. 2 illustrates a NAND memory array 200 as a portion of memory array 104 in accordance with another embodiment of the invention. As shown in FIG. 2, the memory array 200 includes word lines $202_1$ to $202_N$ and intersecting local bit lines $204_1$ to $204_M$. For ease of addressing in the digital environment, the number of word lines 202 and the number of bit lines 204 are each some power of two, e.g., 256 word lines 202 by 4,096 bit lines 204. The local bit lines 204 are coupled to global bit lines (not shown in FIG. 2) in a many-to-one relationship.

Memory array 200 includes NAND strings $206_1$ to $206_M$. Each NAND string includes floating gate transistors $208_1$ to $208_N$, each located at an intersection of a word line 202 and a local bit line 204. The floating gate transistors 208 represent non-volatile memory cells for storage of data. The floating gate transistors 208 of each NAND string 206 are connected in series source to drain between a source select gate 210, e.g., a field effect transistor (FET), and a drain select gate 212, e.g., an FET. Each source select gate 210 is located at an intersection of a local bit line 204 and a source select line 214, while each drain select gate 212 is located at an intersection of a local bit line 204 and a drain select line 215.

A source of each source select gate 210 is connected to a common source line 216. The drain of each source select gate 210 is connected to the source of the first floating gate transistor 208 of the corresponding NAND string 206. For example, the drain of source select gate $210_1$ is connected to the source of floating gate transistor $208_1$ of the corresponding NAND string $206_1$. A control gate 220 of each source select gate 210 is connected to source select line 214. It is common for a common source line to be connected between source select gates for NAND strings of two different NAND arrays. As such, the two NAND arrays share the common source line.

The drain of each drain select gate 212 is connected to the local bit line 204 for the corresponding NAND string at a drain contact 228. For example, the drain of drain select gate $212_1$ is connected to the local bit line $204_1$ for the corresponding NAND string $206_1$ at drain contact $228_1$. The source of each drain select gate 212 is connected to the drain of the last floating gate transistor $208_N$ of the corresponding NAND string 206. For example, the source of drain select gate $212_1$ is connected to the drain of floating gate transistor $208_N$ of the corresponding NAND string $206_1$. It is common for two NAND strings to share the same drain contact.

Typical construction of floating gate transistors 208 includes a source 230 and a drain 232, a floating gate 234, and a control gate 236, as shown in FIG. 2. Floating gate transistors 208 have their control gates 236 coupled to a word line 202. A column of the floating gate transistors 208 is a NAND string 206 coupled to a given local bit line 204. A row of the floating gate transistors 208 are those transistors commonly coupled to a given word line 202.

Figure 3:
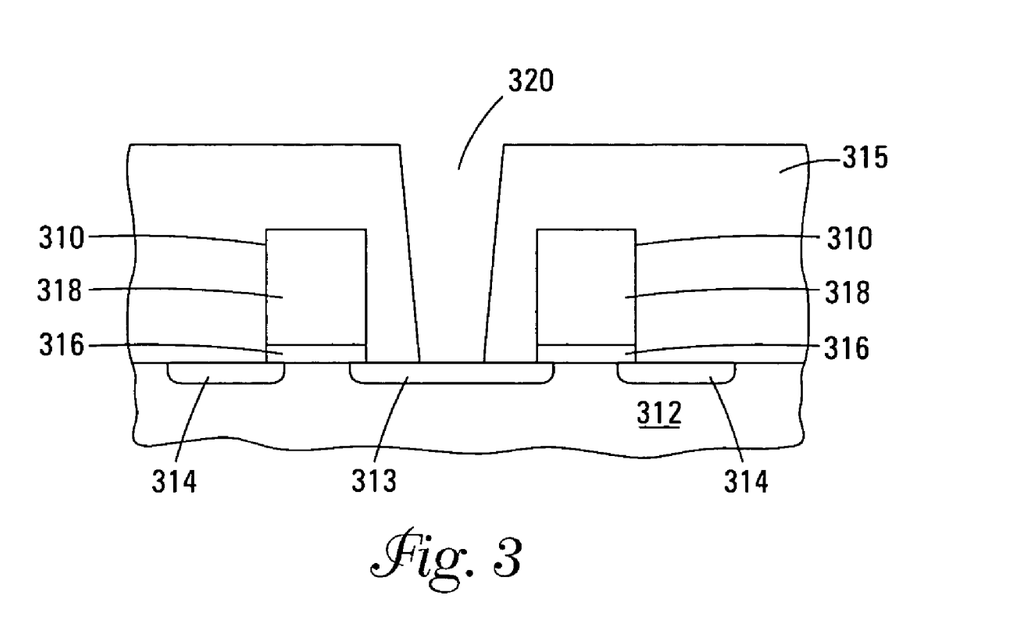
FIG. 3 is a cross-sectional view of a portion of a memory array during a stage of fabrication after several processing steps have occurred according to another embodiment of the present invention.

FIG. 3 depicts a portion of a memory array during a stage of fabrication after several processing steps have occurred according to an embodiment of the present invention. Formation of the structure depicted in FIG. 3 is well known and will not be detailed herein. In general, however, source select gates 310 are formed on a substrate 312, e.g., of silicon, such as monocrystalline silicon. For one embodiment, source select gates 310 share a source/drain region 313 formed on substrate 312. Each of source select gates 310 further includes a source/drain region 314 formed on substrate 312, a gate dielectric 316 formed on substrate 312 between source drain regions 313 and 314, and a control gate 318 formed on gate dielectric 316, as shown in FIG. 3.

Although not shown in FIG. 3, source select gates 310 are each connected to a NAND string, as described above and shown in FIG. 2. The respective NAND strings are connected to drain select gates formed on substrate 312 (not shown in FIG. 3), as described above and shown in FIG. 2. A bulk insulation layer (or dielectric layer) 315 is formed overlying substrate 312, source select gates 310, the NAND strings, the drain select gates, and exposed surfaces of the substrate adjacent the source select gates. One example for the insulation layer 315 would be a doped silicate glass, such as BSG (borosilicate glass), PSG (phosphosilicate glass), and BPSG (borophosphosilicate glass).

Insulation layer 315 is patterned, e.g., with a deep ultraviolet (DUV) photolithography process, to define a source slot 320. Source slot 320 is etched into insulation layer 315 down to substrate 312 between select gates 310 to expose a portion of substrate 312, i.e., the shared source/drain region 313, between select gates 310. Source slot 320 is trench shaped and extends perpendicularly to the plane of FIG. 3 so as to span two or more columns of memory cells (or NAND strings). That is, source slot 320 extends between two or more select gates respectively connected to the two or more NAND strings. For one embodiment, source slot 320 spans an entire memory array, e.g., source slot 320 extends between select gate $210_1$ and $210_M$ of memory array 200 of FIG. 2.

FIGS. 4A–4D generally depict a method of forming a source line 416 in the source slot 320 (shown in FIG. 4D) of the structure of FIG. 3. For one embodiment, source line 416 is a common source line as described for common source line 216 of FIG. 2. That is, two or more source select gates respectively coupled to two or more NAND strings are coupled to source line 416.

Figure 4A:
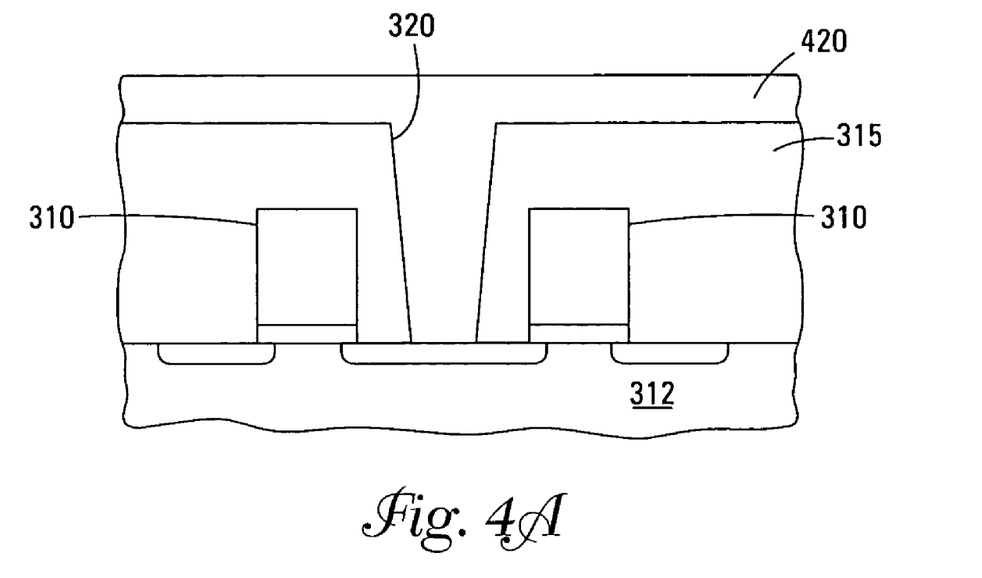
FIGS. 4A–4D are cross-sectional views of a portion of a memory array during various stages of fabrication according to another embodiment of the invention.
Figure 4B:
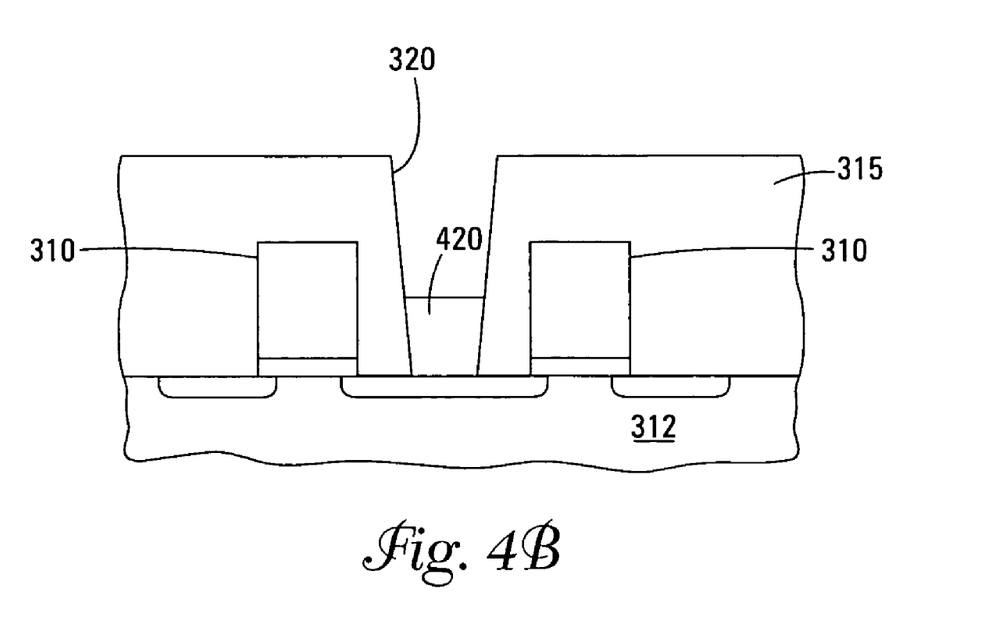

A first conductive layer (or polysilicon layer) 420 is formed over the structure of FIG. 3 so that polysilicon completely fills source slot 320 and contacts the exposed portion of substrate 312, as shown in FIG. 4A, using a suitable deposition technique, such as chemical vapor deposition (CVD). For one embodiment, deposition of polysilicon layer 420 includes in situ conductive doping of the polysilicon, i.e., dopant is added to the polysilicon while polysilicon layer 420 is being formed. Polysilicon layer 420 is etched back and recessed into source slot 320, leaving a portion of source slot 320 above the recessed polysilicon layer 420 unfilled, as shown in FIG. 4B. For one embodiment, the recessed polysilicon layer 420 of FIG. 4B is about 1000 to about 3000 angstroms thick. A dry etch, such as a plasma etch, or a wet etch, e.g., using Tetramethylammonium hydroxide (TMAH), can be used to etch back polysilicon layer 420.

Figure 4C:
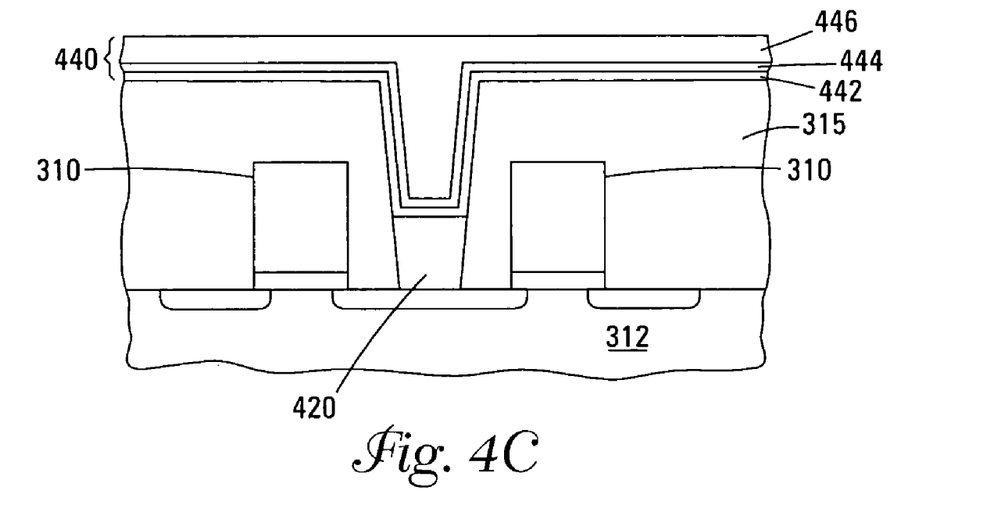

A second conductive layer 440 having a higher electrical conductivity than polysilicon layer 420 is formed on the structure of FIG. 4B, as shown in FIG. 4C, and can be formed using standard metallization procedures. For example, for one embodiment, second conductive layer 440 is formed by depositing a barrier layer 442, e.g., a refractory metal nitride, such as titanium nitride (TiN) or tungsten nitride ($WN_x$), on insulation layer 315 and recessed polysilicon layer 420, e.g., using CVD. An adhesion layer 444, e.g., a metal layer, such as titanium (Ti) is deposited on barrier layer 442, e.g., using CVD. A metal layer 446, such as tungsten (W), is deposited on the adhesion layer 444, e.g., using CVD. In addition to CVD, physical vapor deposition (PVD), e.g., sputtering, can be used. For another embodiment, second conductive layer 440 is refractory metal silicide layer overlying insulation layer 315 and polysilicon plug 430. The metals of chromium (Cr), cobalt (Co), hafnium (Hf), molybdenum (Mo), niobium (Nb), tantalum (Ta), titanium (Ti), tungsten (W), vanadium(V) and zirconium (Zr) are generally recognized as refractory metals.

Figure 4D:
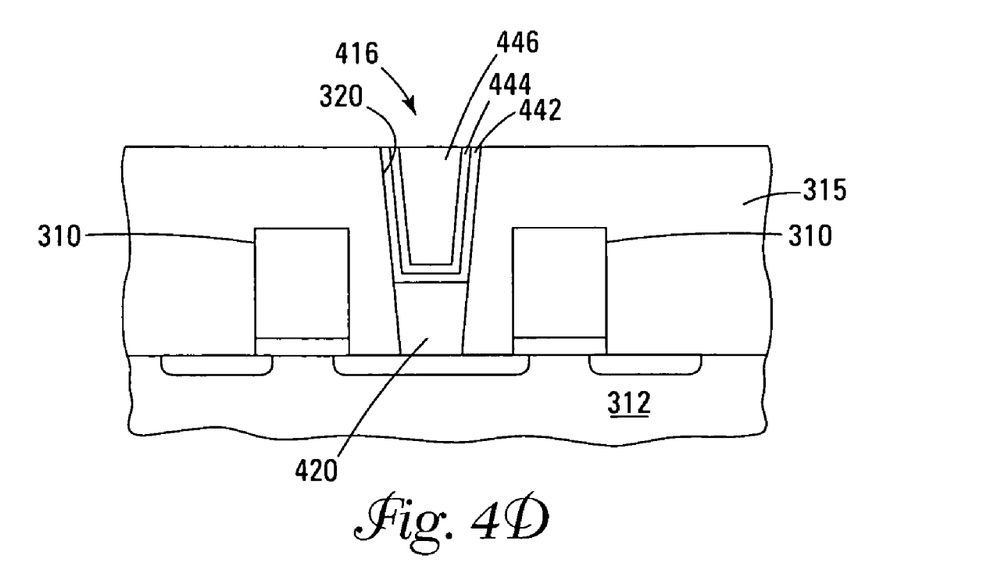

For one embodiment, chemical mechanical planerization (CMP) is performed to produce the structure of FIG. 4D. Specifically, second conductive layer 440 is removed from a surface of insulation layer 315 so that conductive layer 440 is substantially flush with insulation layer 315 and substantially fills the unfilled portion of source slot 320. Recessed polysilicon layer 420 and conductive layer 440 form the source line 416.

Figure 5A:
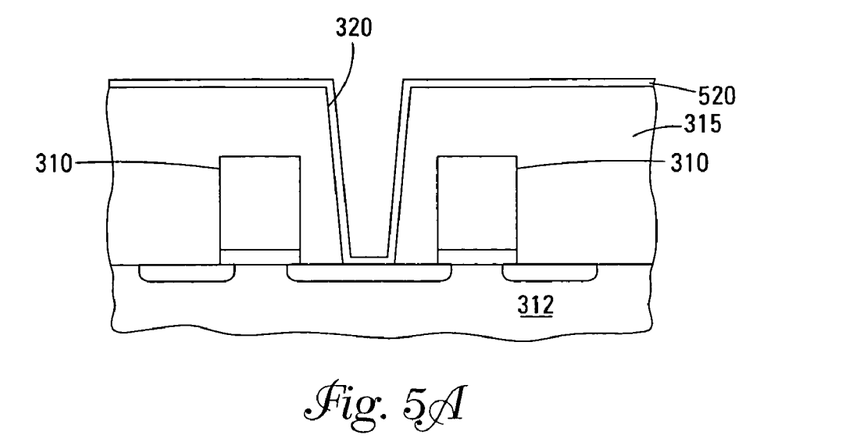
FIGS. 5A–5C are cross-sectional views of a portion of a memory array during various stages of fabrication according to yet another embodiment of the invention.
Figure 5B:
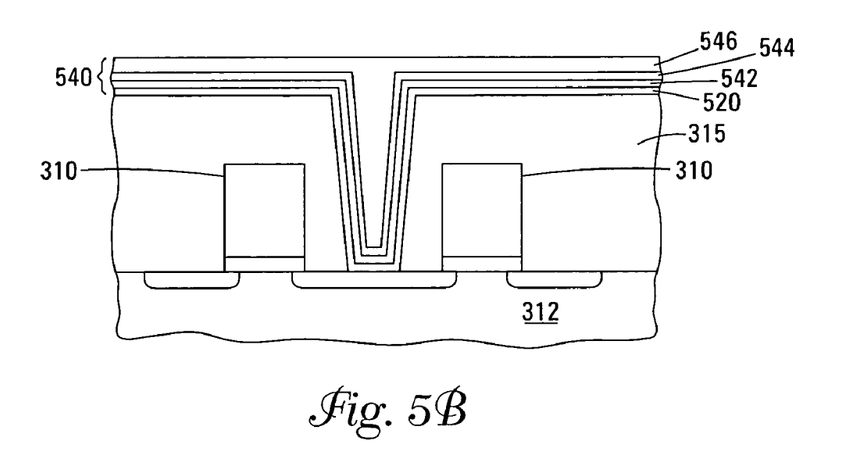
Figure 5C:
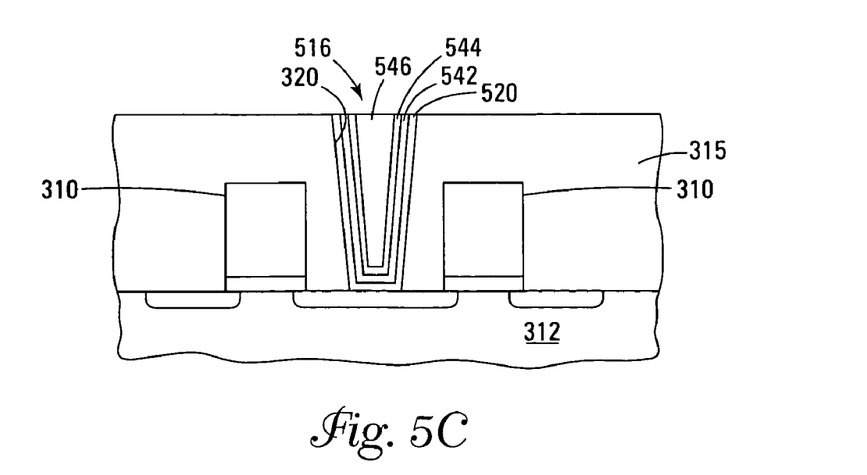

FIGS. 5A–5C generally depict a method of forming a source line 516 in the source slot 320 (shown in FIG. 5C) of the structure of FIG. 3 according to another embodiment of the present invention. A first conductive layer (or polysilicon layer) 520 is formed over the structure of FIG. 3, as shown in FIG. 5A using a suitable deposition technique, such as chemical vapor deposition (CVD). For one embodiment, deposition of polysilicon layer 520 includes in situ conductive doping of the polysilicon, i.e., dopant is added to the polysilicon while polysilicon layer 520 is being formed. As shown in FIG. 5A, polysilicon layer 520 follows the contour of slot 320, rather than completely filling slot 320, as shown in FIG. 4A. Specifically, polysilicon layer 520 coats the interior of slot 320, i.e., polysilicon layer 520 coats the sidewalls of slot 320 and the exposed portion of substrate 312 that forms the bottom of slot 320. This eliminates the etch-back and recessing step of FIG. 4B. For one embodiment, polysilicon layer 520 is about 200 angstroms thick.

A second conductive layer 540 having a higher electrical conductivity than polysilicon layer 520 is formed on the structure of FIG. 5A, as shown in FIG. 5B, and can be formed using standard metallization procedures. For example, for one embodiment, second conductive layer 540 is formed by depositing a barrier layer 542, e.g., a refractory metal nitride, such as titanium nitride (TiN) or tungsten nitride ($WN_x$), on insulation layer 315 and polysilicon layer 520, e.g., using CVD. An adhesion layer 544, e.g., a metal layer, such as titanium (Ti), is deposited on barrier layer 542, e.g., using CVD. A metal layer 546, such as tungsten (W), is on the adhesion layer 544, e.g., using CVD. In addition to CVD, physical vapor deposition (PVD), e.g., sputtering, can be used. For another embodiment, second conductive layer 540 is refractory metal silicide layer overlying insulation layer 315 and polysilicon layer 520.

For one embodiment, CMP is performed to produce the structure of FIG. 5C. Specifically, the second conductive layer 540 and polysilicon layer 520 are removed from a surface of insulation layer 315 so that second conductive layer 540 is substantially flush with insulation layer 315 and substantially fills an unfilled portion of source slot 320. Polysilicon layer 520 contains second conductive layer 540 and separates second conductive layer 540 from insulation layer 315 and the exposed portion of substrate 312. Polysilicon layer 520 and conductive layer 540 form the source line 516.

Figure 6A:
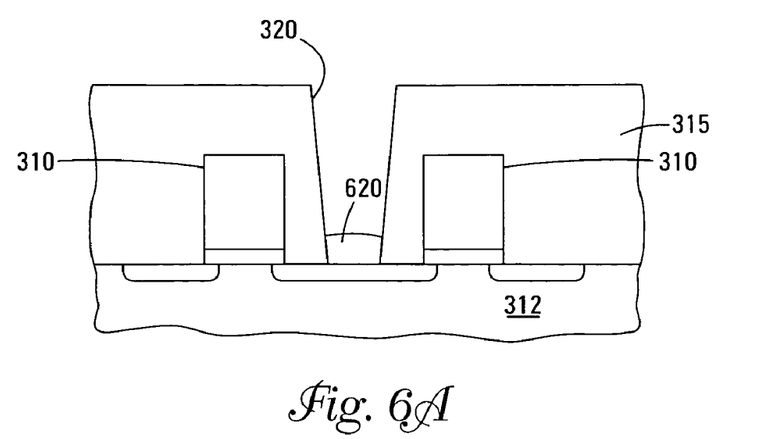
FIGS. 6A–6C are cross-sectional views of a portion of a memory array during various stages of fabrication according to still another embodiment of the invention.
Figure 6B:
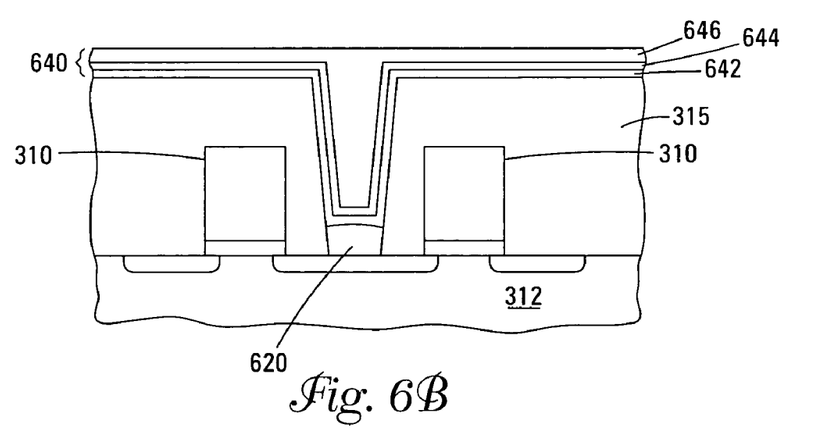
Figure 6C:
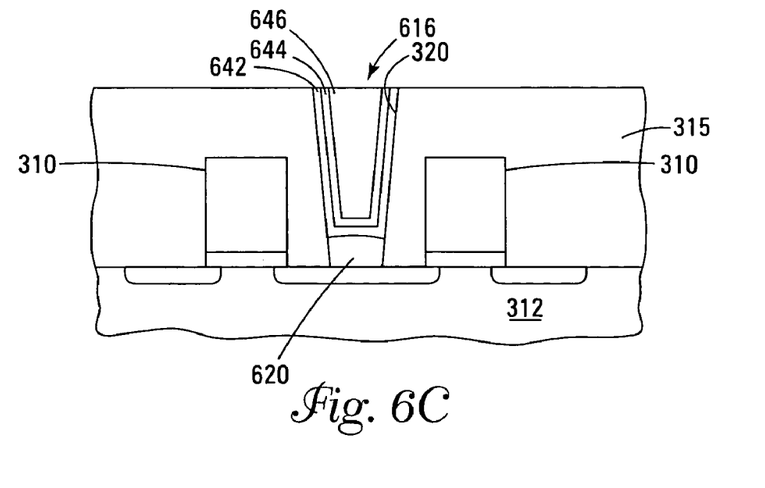

FIGS. 6A–6C generally depict a method of forming a source line 616 in the source slot 320 (shown in FIG. 6C) of the structure of FIG. 3 according to another embodiment of the present invention. Referring to FIG. 6A, an epitaxial silicon layer 620 is selectively grown, or deposited, on the exposed monocrystalline silicon of substrate 312 within slot 320 so as to leave a portion of source slot 320 above epitaxial silicon layer 620 unfilled. For one embodiment, epitaxial silicon layer 620 is conductively doped, e.g., using ion implantation after its formation. Epitaxial deposition and ion implantation are well understood in the art and will not be discussed further here. Selectively growing epitaxial silicon layer 620 on the exposed substrate eliminates the etch-back and recessing step of FIG. 4B because epitaxial silicon layer 620 grows generally upward from the bottom of source slot 320. For one embodiment, epitaxial silicon layer 620 is about 500 to about 1000 angstroms thick.

A conductive layer 640 having a higher electrical conductivity than epitaxial silicon layer 620 is formed on the structure of FIG. 6A, as shown in FIG. 6B, and can be formed using standard metallization procedures. For example, for one embodiment, conductive layer 640 is formed by depositing a barrier layer 642, e.g., a refractory metal nitride, such as titanium nitride (TiN) or tungsten nitride ($WN_x$), on insulation layer 315 and epitaxial silicon layer 620, e.g., using CVD. An adhesion layer 644, e.g., a metal layer, such as titanium (Ti), is deposited on barrier layer 642, e.g., using CVD. A metal layer 646, such as tungsten (W), is deposited on the adhesion layer 644, e.g., using CVD. In addition to CVD, physical vapor deposition (PVD), e.g., sputtering, can be used. For another embodiment, conductive layer 640 is refractory metal silicide layer overlying insulation layer 315 and epitaxial silicon layer 620.

For one embodiment, CMP is performed to produce the structure of FIG. 6C. Specifically, the conductive layer 640 is removed from a surface of insulation layer 315 so that conductive layer 640 substantially fills the unfilled portion of source slot 320 and is substantially flush with insulation layer 315. Epitaxial silicon layer 620 and conductive layer 640 form the source line 616.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of forming a portion of a NAND memory array, the method comprising:
   forming a source line, wherein forming the source line comprises:
      forming a source slot in a bulk insulation layer overlying a substrate to expose a portion of the substrate within the source slot, wherein the exposed portion of the substrate includes source regions of select gates associated with two or more columns of serially-connected floating-gate transistors formed on the substrate;
      growing a layer of epitaxial silicon on the exposed portion so as to partially fill the source slot;
      forming a conductive layer on the bulk insulation layer and on the layer of epitaxial silicon so as to substantially fill an unfilled portion of the source slot; and
      removing the conductive layer from a surface of the bulk insulation layer.

2. The method of claim 1, further comprising doping the layer of epitaxial silicon after its formation.

3. The method of claim 2, wherein doping the layer of epitaxial silicon comprises ion implantation.

4. The method of claim 1, wherein forming the conductive layer comprises:
   forming a barrier layer on the layer of epitaxial silicon and the bulk insulation layer;
   forming a first metal layer on the barrier layer; and
   forming a second metal layer on the first metal layer.

5. The method of claim 4, wherein the barrier layer, first metal layer, and second metal layer are respectively of titanium nitride, titanium, and tungsten.

6. The method of claim 1, wherein the layer of epitaxial silicon is about 500 angstroms to about 1000 angstroms.

7. A method of fabricating a portion of a memory device, comprising:
   forming two or more columns of memory cells of a memory array, wherein forming each column of memory cells comprises forming a plurality of serially-connected floating-gate transistors overlying a substrate;
   forming a first source select gate overlying the substrate and coupled to a drain of a source of a first floating-gate transistor of a first column of the two or more columns of memory cells;
   forming a second source select gate overlying the substrate and coupled to a drain of a source of a first floating-gate transistor of a second column of the two or more columns of memory cells;
   forming a layer of dielectric material overlying the first and second source select gates, the two or more columns of memory cells, and exposed surfaces of the substrate adjacent the first and source select gates;
   patterning the layer of dielectric material to define a source slot;
   etching the source slot into the layer of dielectric material to expose a portion of the substrate within the source slot, wherein the exposed portion of the substrate includes source regions of the first and second source select gates;
   growing a layer of epitaxial silicon on the exposed portion;
   forming a conductive layer on the layer of dielectric material and on the layer of epitaxial silicon; and
   removing the conductive layer from a surface of the layer of dielectric material.

8. The method of claim 7, further comprising doping the layer of epitaxial silicon after its formation.

9. The method of claim 7, wherein forming the conductive layer comprises:
   forming a barrier layer on the layer of epitaxial silicon and the layer of dielectric material;
   forming a first metal layer on the barrier layer; and
   forming a second metal layer on the first metal layer.

10. The method of claim 9, wherein the barrier layer, first metal layer, and second metal layer are respectively of titanium nitride, titanium, and tungsten.

11. The method of claim 7, wherein the layer of epitaxial silicon is about 500 angstroms to about 1000 angstroms.

12. The method of claim 7, wherein the conductive layer has a higher electrical conductivity than the layer of epitaxial silicon.

13. A method of forming a portion of a NAND memory array, the method comprising:
    forming a source line, wherein forming the source line comprises:
        forming a source slot in a bulk insulation layer overlying a substrate to expose a portion of the substrate within the source slot, wherein the exposed portion of the substrate includes source regions of select gates associated with two or more columns of serially-connected floating-gate transistors formed on the substrate;
        growing a layer of epitaxial silicon on the exposed portion so as to partially fill the source slot;
        forming a conductive layer on the bulk insulation layer and on the layer of epitaxial silicon so as to substantially fill an unfilled portion of the source slot; and
        removing the conductive layer from a surface of the bulk insulation layer;
    wherein the conductive layer has a higher electrical conductivity than the layer of epitaxial silicon.

14. The method of claim 13, further comprising doping the layer of epitaxial silicon after its formation.

15. The method of claim 14, wherein doping the layer of epitaxial silicon comprises ion implantation.

16. The method of claim 13, wherein the conductive layer is a refractory metal silicide layer.

17. The method of claim 13, wherein forming the conductive layer comprises:
    forming a barrier layer on the layer of epitaxial silicon and the bulk insulation layer;
    forming a first metal layer on the barrier layer; and
    forming a second metal layer on the first metal layer.

18. The method of claim 17, wherein the barrier layer, first metal layer, and second metal layer are respectively of titanium nitride, titanium, and tungsten.

19. The method of claim 13, wherein the layer of epitaxial silicon is about 500 angstroms to about 1000 angstroms.

20. The method of claim 17, wherein the conductive layer is removed from the surface of the bulk insulation layer using CMP.

* * * * *